(12) United States Patent
Miele et al.

(10) Patent No.: US 6,967,179 B2
(45) Date of Patent: Nov. 22, 2005

(54) PROCESS FOR MANUFACTURING BORON NITRIDE FIBERS FROM BORYLBORAZINES

(75) Inventors: Philippe Miele, Lyon (FR); Berangere Toury, Nogent sur Marne (FR); Samuel Bernard, Prisches (FR); David Cornu, Villeurbanne (FR); Khaled Ayadi, Le Pont de Claix (FR); Loic Rousseau, St Aubin de Medoc (FR); Guy Beauhaire, Bougival (FR)

(73) Assignee: Eads Launch Vehicles, Paris (FR)

( * ) Notice: Subject to any disclaimer, the term of this patent is extended or adjusted under 35 U.S.C. 154(b) by 144 days.

(21) Appl. No.: 10/347,452

(22) Filed: Jan. 21, 2003

(65) Prior Publication Data

US 2004/0044162 A1 Mar. 4, 2004

(30) Foreign Application Priority Data

Jan. 22, 2002 (FR) ............................................. 02 00758

(51) Int. Cl.$^7$ ............................................... C04B 35/00
(52) U.S. Cl. ......................... 501/95.1; 501/96.4; 528/4; 528/7; 528/394; 528/422
(58) Field of Search ................ 528/4, 7, 394, 528/422; 501/95.1, 96.4

(56) References Cited

U.S. PATENT DOCUMENTS

| | | | |
|---|---|---|---|
| 3,429,722 A | 2/1969 | Economy et al. | |
| 5,061,469 A | 10/1991 | Kimura | |
| 5,118,774 A | * 6/1992 | Mignani et al. | ................ 528/7 |
| 5,188,757 A | 2/1993 | Paine, Jr. et al. | |
| 5,470,933 A | 11/1995 | Mignani et al. | |

FOREIGN PATENT DOCUMENTS

| | | |
|---|---|---|
| EP | 0 278 734 | 8/1988 |
| EP | 0 342 673 | 11/1989 |
| FR | 2 695 645 | 3/1994 |
| GB | 2 014 972 | 9/1979 |
| WO | WO 01/68960 | 9/2001 |

OTHER PUBLICATIONS

Abstract of the paper entitled "Boron Nitride Synthesis from Aminoboranes and Aminoborazine Mixture" from the Proceedings o the 11$^{th}$ International Symposium on Boron, Borides, and Related Compounds, 1993, 178–179.*
T. Wideman, et al., Chem. Mater., vol. 10, pp. 412–421, "Amine–Modified Polyborazylenes: Second–Generation Precursors to Boron Nitride", 1998.
R. T. Paine, et al., Chem. Rev., vol. 90, No. 4, pp. 73–91, "Synthesis Routes to Boron Nitride", 1990.
C. K. Narula, et al., Chemistry of Materials, vol. 2, pp. 377–384, "Models and Polyborazine Precursors for Boron Nitride Ceramics", 1990.
U.S. Appl. No. 10/220,269, filed Sep. 6, 2002, Rousseau, et al.
U.S. Appl. No. 10/346,121, filed Jan. 17, 2003, Miele, et al.

* cited by examiner

Primary Examiner—Randy Gulakowski
Assistant Examiner—Marc Zimmer
(74) Attorney, Agent, or Firm—Oblon, Spivak, McClelland, Maier & Neustadt, P.C.

(57) ABSTRACT

The aim of the present invention is a process for manufacturing boron nitride fibers, in particular continuous boron nitride fibers with good mechanical properties, which may be used for producing ceramic composite materials such as BN/BN composites, thermostructural parts or antenna radomes.

It provides and uses a precursor polymer of formula (I) below:

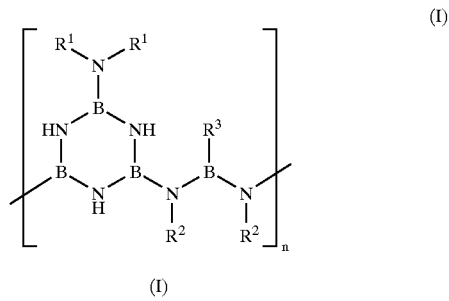

(I)

in which n is a whole number, $R^1$ and $R^2$, identical or different, represent independently an alkyl group, and $R^3$ represents an amino group, a hydrogen atom, an alkyl, a cycloalkyl or a boryl.

40 Claims, No Drawings

PROCESS FOR MANUFACTURING BORON NITRIDE FIBERS FROM BORYLBORAZINES

TECHNICAL FIELD

The aim of the present invention is a process for manufacturing boron nitride fibres, in particular continuous boron nitride fibres with good mechanical properties, which may be used for producing ceramic composite materials such as BN/BN composites, thermostructural parts or antenna radomes.

More precisely, it concerns the manufacture of boron nitride fibres from a precursor polymer that one shapes by spinning to form polymer fibres that are then subjected to a ceramisation in order to transform them into boron nitride fibres.

The ceramic boron nitride fibres of the present invention are very useful for the manufacture of composite materials with good oxidation resistance, thermal stability and electrical insulation properties.

For composite materials, particularly ceramic matrix materials, it is in fact preferable to have continuous fibres to improve the fracture resistance of the ceramic.

Moreover, it is necessary to use flexible fibres with high tensile strengths.

STATE OF THE PRIOR ART

The references in square brackets [ ] refer to the appended list of references.

There are numerous processes for manufacturing boron nitride, as described by R. T. PAINE et al, [1]. Amongst the methods described in this document, one finds in particular processes using precursor polymers formed from inorganic boron compounds such as borazenes.

One way of obtaining said precursor polymers has been described by C. K. Narula et al [2]. It consists in reacting trichloroborazine or 2-(dimethylamino)-4,6-dichloroborazine with hexamethyl disilazane in solution in dichloromethane at ambient temperature. In the case where one uses 2-(dimethyl amino)-4,6-dichloroborazine, one favours the polymerisation in two points due to the presence of the $NMe_2$ group.

Another way of obtaining precursor polymers, described in EP-A-O 342 673 [3], consists in reacting a B-tris (lower alkyl amino) borazine with an alkyl amine such as lauryl amine, thermally in bulk or in solution.

One may also obtain other precursor polymers by thermal polycondensation of trifunctional aminoborazines of formula $[B(NR^1R^2)—NR^3—]_3$ in which $R^1$, $R^2$ and $R^3$, which are identical or different, represent hydrogen, an alkyl radical or an aryl radical, as described in FR-A-2 695 645 [4].

The polymers described above are well suited to obtaining powder or other forms of boron nitride but it is more difficult to prepare more complex forms, in particular fibres, from such polymers.

Often, in fact, the drawing of the precursor polymer necessary for shaping the fibres is poor due to its statistical, cross-linked structure, which leads to little extension, making proper control of the section of the fibre very hazardous. Further on in the process, this results in the breaking of fibres or weak points, which lead to very poor ultimate mechanical properties.

Thus, as is indicated by T. Wideman et al [5], research has been carried out to find other precursor polymers that are better suited to obtaining boron nitride fibres. In this document, it is indicated that a precursor polymer that is spinnable in the melted state may be obtained by modifying polyborazylene by reaction with a dialkyl amine.

It therefore appears that numerous pathways have been considered for manufacturing boron nitride fibres, but without success.

The materials obtained according to the prior art are matrices or solid BN, but not continuous fibres of boron nitride of good quality, which is indispensable for the manufacture of ceramic composite materials with good mechanical performance.

DESCRIPTION OF THE INVENTION

The precise aim of the present invention is to make up for the aforementioned disadvantages of the prior art and to provide a precursor polymer for fibres that has the aforementioned required qualities, particularly as regards the manufacture of boron nitride fibres.

The aim is achieved, according to the present invention, by using the following precursor polymer of formula (I):

$$\left[ \begin{array}{c} R^1\diagdown_N\diagup R^1 \\ | \\ B \\ HN\diagup \diagdown NH \quad R^3 \\ | \quad | \quad | \\ \diagdown B\diagdown_N\diagup B\diagdown_N\diagup B\diagdown_N\diagup \\ | \quad H \quad | \quad | \\ \quad\quad R^2 \quad R^2 \end{array} \right]_n$$ (I)

in which n is a whole number, $R^1$ and $R^2$, identical or different, represent independently an alkyl group, and $R^3$ represents an amino group, a hydrogen atom, an alkyl, a cycloalkyl or a boryl.

Advantageously, according to the present invention, the alkyl group $R^1$ represents the methyl group. It could however represent other alkyls, for example with two or three carbons.

Advantageously, according to the present invention, the alkyl group $R^2$ represents the methyl group. It could however represent, independently of $R^1$, other alkyls, for example with two or three carbons, for example ethyl or propyl.

Advantageously, according to the present invention, the alkyl group $R^3$ represents an alkyl amine, comprising for example from 1 to 3 carbon atoms, and preferably $R^3$ is $NHCH_3$.

This structure provides great flexibility to the resulting polymer, which may be very easily formed into a thread. Ceramisation of these threads makes it possible to obtain boron nitride fibres.

Thus, the present invention also concerns a process for manufacturing boron nitride fibres by spinning of a precursor polymer and ceramisation of the polymer fibres obtained by spinning, in which the precursor polymer has the formula (I) defined above.

Advantageously, according to the present invention, the precursor polymer may be obtained by implementing the following steps:

Reacting $HN(R^1)_2$ with trichloroborazine in a 1/1 stoichiometric ratio in moles to give the following borazine of formula (II):

$$\begin{array}{c} R^1\diagdown_N\diagup R^1 \\ | \\ B \\ HN\diagup \diagdown NH \\ | \quad | \\ Cl\diagdown B\diagdown_N\diagup B\diagdown Cl \\ H \end{array}$$ (II)

Reacting, without heating, the borazine of formula (II) with an alkyl aminoborane of formula $R^3B(NHR^2)_2$ in a 1/1 stoichiometric ratio in moles, in the presence of a tertiary amine —$N(R^4)_3$, in which $R^1$, $R^2$ and $R^3$ are as defined above, and $R^4$ is an alkyl group.

According to the present invention, $R^4$ is advantageously an alkyl group comprising from 1 to 3 carbon atoms, and preferably an ethyl.

The technique used in the invention is based on the chemical polymerisation of borazines.

The process requires the stoichiometric quantities between the borazine of formula (II) and the alkyl aminoborane $R^3B(NHR^2)_2$ to be respected, preferably as precisely as possible, in other words 1/1 molar proportions of these two compounds.

The trismethylaminoborane, where $R^2$=$CH_3$ and $R^3$=$NHCH_3$ in the compound of formula (III), is the preferred aminoborane for the synthesis of the precursor polymer because the NHMe groups have a very high reactivity towards the chlorine atoms.

The introduction of the initial reagents is advantageously properly controlled (strict mass) in order to obtain the desired polymer.

The present invention therefore uses a not very cross-linked borylborazine type polymer obtained without heating, in other words at ambient temperature, for example at a temperature of between 10 to 35° C., for the manufacture of boron nitride fibres.

According to the invention, to form the ends of the chains, a slight excess of amine $HN(R^1)_2$ may be added at the beginning of the synthesis of the compound (II), which implies a low proportion of disubstituted borazines of formula $(NR^1)_2ClB_3N_3H_3$ which will serve as chain blockers to limit the level of polycondensation.

It is also possible to react an alkyl amine $HNR^5R^6$ with the polymer obtained in solution in order to substitute in-fine the chlorine atoms on the ends of the chains, where $R^5$ and $R^6$ are independently an alkyl, aryl or boryl. The proportion of chain blocking groups determines the repetition n of the base unit of formula (I). Said (n) is for example between 5 and 30, and preferably between 10 and 20. Polymerisation through the bridging boryl group cannot however be excluded, although it is very improbable due to steric hindrance. This is why, in the case where $R^3$ is an alkyl amino group, the polymer may be slightly cross-linked.

According to the invention, the polymerisation is preferably carried out under an inert atmosphere.

Once the reaction has ended, the polymer, soluble in the solvent, may be separated from the amine chlorohydrate $N(R^4)_3$·HCl, for example, by filtration and the solvent may be eliminated, for example, by evaporation under reduced pressure.

Advantageously, according to the invention, the polymer may be remelted after its synthesis in order to homogenise it and to make it compact before spinning. This may be done for example by a brief rise in temperature, up to its softening temperature.

According to the invention, the spinning step is preferably carried out under a controlled atmosphere and the inventors have observed that it is preferable to maintain the relative humidity level of this atmosphere at a value of less than 10% and preferably less than 2%.

For the spinning, the polymer may be extruded through a die of 50 to 500 $\mu$m and more particularly from 100 to 200 $\mu$m, which is surmounted by a filter and a cutting element. The drawing of the polymer thread may be achieved by means of a refractory spool with a diameter of between 50 and 200 mm, and more precisely from 50 to 100 mm. Said spool may, for example, be in graphite.

The present invention advantageously allows the spinning temperature to be reduced by 30 to 100° C. compared to the polymers and processes of the prior art.

In order to obtain good results, the spinning is preferably carried out at a spinning temperature Tf such that 30° C.$\leq$Tf−Tg$\leq$100° C., and preferably 30° C.$\leq$Tf−Tg$\leq$70° C., where Tg is the glass transition temperature of the polymer.

The glass transition temperature of the polymer of the present invention is around 25 to 80° C. according to the value of n or the proportion of borazine (III).

The precursor polymer of formula (I) of the present invention has the particularity of having a pseudo-linear or not very cross-linked structure because one of the three sites of the initial trichloroborazine (TCB) precursor is rendered non-reactive. The molecular weight dispersion is therefore more limited.

In addition, the chemical polycondensation of the present invention makes it possible to form a polymer in which the borazine cycles $B_3N_3$ are linked uniquely by original N—B—N type three atom intercyclic bonds. The polycondensation mechanism is therefore one to one. At ambient temperature, in other words between 10 to 35° C., for example at around 25° C., the cyclic protons are not reactive enough to react with the atoms of chlorine. The formation of 3 atom bridges between two cycles is therefore the only mechanism possible.

Moreover, the specific structure of the polymer of the present invention makes it possible to control the number of cycles per chain and thus to control the molecular weight of the polymer and thus its glass transition temperature.

Said structure of the present invention improves the rheological characteristics of the polymers obtained and provides great flexibility to the polymers, which may be very easily spun.

The advantages of the process of the present invention using this specific polymer are multiple.

One may cite for example faster polycondensation at ambient temperature, which is very useful from an energy point of view. The time savings are considerable because the polymerisation is carried out by chemical reaction at low temperature, thus without thermolysis.

Moreover, thanks to the process of the present invention, and the one to one nature of the polycondensation mechanism, only the creation of three atom bridges between the borazine cycles is possible.

Furthermore, the ceramic yield is relatively high since the polymer contains methyl type alkyl groups. This yield may reach 50%.

Compared to the thermal polycondensation reactions of the prior art, the process of the present invention moreover provides a better control of the growth of the polymer. In fact, the quantities of the initial reagents may be added in controlled quantities, which allows a polymer whose molecular weight can be controlled to be obtained.

According to the present invention, the ceramisation treatment may be carried out by the traditional methods generally used for the transformation of precursor polymer fibres based on aminoborazines into boron nitride, by subjecting them to a heat treatment in the presence of ammonia, then nitrogen and, if necessary, an inert gas such as argon.

According to the invention, the ceramisation step is advantageously carried out in two stages, by carrying out a first pre-ceramisation stage with ammonia up to a temperature less than or equal to 1000° C., then carrying out a second stage of ceramisation under a nitrogen and/or noble gas atmosphere at higher temperatures, particularly from 1400 to 2200° C., in one or several successive operations.

For these treatments, one can use a heating unit that makes it possible to increase the temperature at a rate of 5 to 1000° C./h, and preferably from 15 to 700° C./h.

The high performance boron nitride fibre obtained from the polymer of the present invention is a continuous hexagonal boron nitride fibre that can be woven, in the form of monofilament or a roving of filaments, and the filament(s) have an average tensile strength $\sigma_R$ of at least 800 MPa, and preferably from 800 to 2000 MPa, an average Young's modulus E of 50 to 250 GPa, and preferably from 50 to 190 GPa, and an average elongation at break distribution $\epsilon_R$ of 0.2 to 2%, and preferably from 0.2 to 1%.

It should be pointed out that the median tensile strength $\sigma_R$ is determined on around fifty filaments with a test length of 1 cm. The break tests are analysed by the Weibull model, where the median tensile strengths are determined for a break probability equal to 0.63. One defines an average value for the average elongation at break ($\epsilon_R$) distribution and from this value, one calculates the median value of the tensile strength ($\sigma_R$) distribution at a survival probability of 0.63. One can then deduce the average Young's modulus or elasticity E.

According to the invention, the diameter of the filament(s) making up the fibre is preferably 4 to 25 $\mu$m.

The boron nitride forming the fibres is hexagonal boron nitride. This structure corresponds to a stacking of hexagonal planes of BN. This type of structure is described, for example, in patent application FR-A-2 806 422.

According to the invention, the fibre advantageously has an impurity level of less than 1%, in particular it contains less than 0.1% by weight in total of elements of atomic weight greater than 11, and has a specific gravity greater than or equal to 1.8 g/cm$^2$.

Moreover, the fibre conserves its high performance under natural ageing. In fact, under accelerated ageing at 65° C., in an atmosphere with a relative humidity of 75%, no measurable reduction in the mechanical properties after two months is observed.

The fibres of the present invention have excellent spinnability and, as a result, allow easy spinning, whereas with the polymers of the prior art this step is very delicate. The fibres obtained are continuous, high performance fibres.

The industrial applications of the present invention are numerous, amongst which one may cite in a general manner the manufacture of composite materials, by way of example, the manufacture of boron nitride fibres that may be used, for example, for making BN/BN composites, structural parts or high structural temperature antenna radomes.

Said fibres may be used for example alone, but also in a resin matrix, for example epoxy or in a ceramic matrix for the manufacture of structural parts, for example in the automobile sector, the aviation sector and machines in a general manner, etc.

Moreover, according to the present invention, the polymer of formula (I) described above may be advantageously used for the manufacture of coatings that protect against oxidation, boron nitride foams, BN/C or BN/BN composite materials or heat sinks in the microelectronics field.

Other advantages and characteristics of the present invention will become clear to those skilled in the art through the examples below, given by way of illustration and in nowise limitative.

EXAMPLES

Example 1

Synthesis of the Polymer 4.8 g of 2,4,6-trichloroborazine (TCB=Cl$_3$B$_3$N$_3$H$_3$) were solubilised in 120 ml of toluene and 10 ml of triethylamine (1 equivalent). To the resulting solution was added 1.175 g of Me$_2$NH by cryogenic pumping. After filtration, and evaporation under vacuum of the solvent, borazine was obtained: (NMe$_2$) Cl$_2$B$_3$N$_3$H$_3$ (a).

This first step consists in preparing, in particular, a borazine type monomer in which one of the three functions is rendered non-reactive at the synthesis temperature. Said monomer only then contains two reactive "chlorine" functions. During said reaction, an atom of chlorine in the TCB is replaced by a N(CH$_3$)$_2$ group and one equivalent of HCl is liberated. This species is gaseous under these conditions and may be captured by one equivalent of triethyl amine (Et$_3$N) forming a solid compound Et$_3$N. HCl that then precipitates.

After this first step, the modified borazine (1 equivalent), 15 ml of triethylamine was injected by means of a pouring phial into 2.21 g of B (NHMe)$_3$ solubilised in 50 ml of toluene. After agitation, filtration and evaporation, 4.3 g of a powdery light orange solid, soluble in most organic solvents, was obtained. The polymer was then introduced into a reactor then remelted up to 150° C. under argon.

This second step concerns the preparation of the polymer. The reaction is similar to that described hereabove, in other words the alkyl aminoborane can react with a chlorine function through its NHCH$_3$ functions, forming a non-isolable intermediate compound, which can then in turn react with an identical molecule. The reiteration of this process leads to the formation of the polymer (b).

The prior substitution of one of the atoms of boron in the cycle by NR$_3$ allows the polycondensation to be oriented along the two remaining directions. Moreover, the steric hindrance due to the NMeH groups remaining on the intercyclic bridge prevent the approach of another cycle in the direction of the —NMeH group remaining on the intercyclic bridge.

The resulting polymer was identified as being polymer (b) indicated in FIG. 1 below, in which n is a whole number, from for example 5 to 30, and preferably from 10 to 20.

It is formed of cycles linked exclusively by N—B—N three atom bridges and is thus pseudo-linear and not very cross-linked. The end of the chains is formed by an additional N(CH$_3$)$_2$ group present on a low proportion of the monomers.

The measured softening point of this polymer was around 140° C.

The DSC analysis carried out on this product indicated a Tg of around 25° C.

FIG. 1:
Chemical synthesis of the polymer

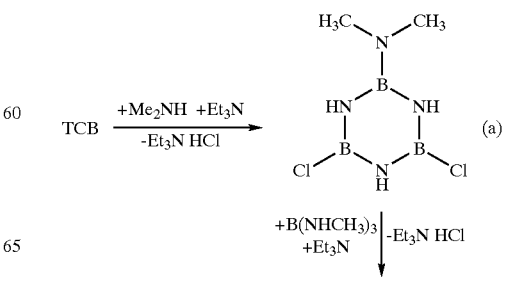

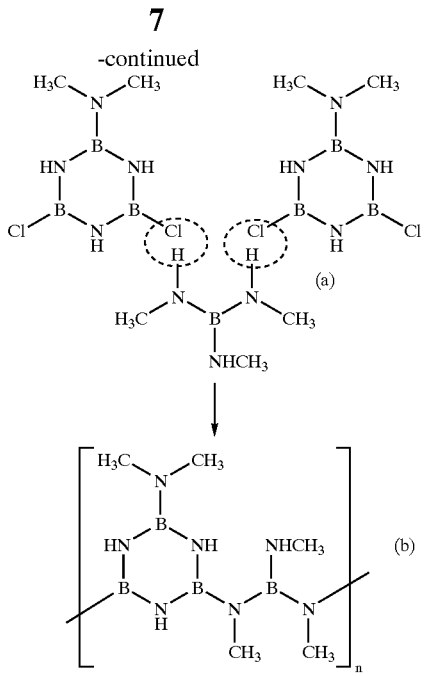

Example 2

Spinning of the Chemical Polymer: Obtaining Boron Nitride Fibres (BN)

In the following example, the fibres obtained were characterised by Raman spectrometry and chemically analysed by electronic spectroscopy (ESCA) as being hexagonal boron nitride fibres exempt of carbon. Their diameter, mechanical properties and structures were then determined.

The diameters were evaluated by the laser interferometry method using the Fraunhofer approximation. These are monofilaments that play the role of diffraction slits. The technique consists in measuring the distance between two consecutive interference bands, knowing the wavelength of the laser and the distance between the monofilament and the measuring screen.

The mechanical properties were determined by means of a microtraction machine. Frames on cardboard were arranged in the jaws in such a manner that the test corresponded to the traction of the monofilament. A traction force was applied to the monofilament. The tests were carried out on fifty or so monofilaments with a test length of 1 cm. The break tests on these filaments were carried out by the Weibull model where the tensile strengths were determined for a probability of break equal to 0.63. An average value for the distribution of the elongations at break ($\epsilon_R$) was defined and from this value the median value of the distribution of the elongations at break ($\epsilon_R$) at a survival probability of 0.37 was calculated. The Young's module or elasticity E could then be deduced from this.

The structural state of the filaments was determined by X-ray diffraction and Raman diffusion. The width at mid-height of the X-ray diffraction ray (002), which was situated at a 2 θ value of 26.765° for the hexagonal boron nitride, provided information on the crystallinity of the filament along the axis c.

The polymer was spun on a FILAMAT2 (trademark) of the PRODEMAT Company, with a die of 200 μm, with the polymer manufactured as indicated in example 1 above, at a temperature of 151° C., while extruding at a speed of 0.4 to 0.6 mm/min under a force varying from 20 to 40 daN and winding it onto a graphite spool of 50 and 100 mm diameter at a drawing speed of 40 to 200 cm/s.

The polymer extruded very well around 90° C., and the spinning was comfortable. The spinning temperature was lower by around 100° C. than the temperature that must be used for polymers of the prior art.

A pre-ceramisation treatment under ammonia up to 600° C. was then carried out in order to eliminate the methyl groups in the initial polymer, then under nitrogen up to 1800° C.

The pre-ceramisation and ceramisation heat treatments carried out were as follows:

Heat Treatment:
a) Pre-ceramisation: heating up to 600° C., at a rate of 25° C./h, under $NH_3$.
b) Ceramisation:
 Heating from 600 to 1100° C., at a rate of 100° C./h, under $N_2$.
 Maintaining at 1100° C., under $N_2$, for 90 minutes.
 Cooling down to ambient temperature.
 Heating up to 1400° C., at a rate of 600° C./h, under $N_2$.
 Maintaining at 1400° C., under $N_2$, for 1 hour.
 Heating from 1400 to 1600° C., at a rate of 600° C./h, under $N_2$.
 Maintaining at 1600° C., under $N_2$, for 1 hour.
 Heating from 1600 to 1800° C., at a rate of 600° C./h, under $N_2$.
 Maintaining at 1800° C., under $N_2$, for 1 hour.

The treatment was carried out under mechanical strain by withdrawing the polymer on the refractory spool during the increase in temperature. The interest in continuing the treatment up to 1800° C. is to crystallise the boron nitride and position the BN crystals parallel to the axis of the fibre.

The fibres were then cooled to ambient temperature and they were characterised mechanically and structurally. They had a white appearance and were slightly slack around the spool, but not broken.

The results of the pulling test obtained on the different samples produced are summarised in Table 1 below.

In this table, E1 and E2 represent different samples produced according to the process of this example, while V represents the rate of spooling, Φ the diameter of the fibres, $\sigma_R$ the tensile strength and E the elasticity module.

X-Ray and Raman spectra were recorded on these fibres; they were characteristic of crystallised hexagonal boron nitride.

This is the first time, thanks to the process of the present invention, that a chemically produced polymer can be spun comfortably.

This result is even more remarkable given that the mechanical characteristics are good, and one achieves in a single test a tensile strength of 1000 MPa, practically as much as with the thermal poly(amino)borazines of the prior art.

TABLE 1

| | E1 | E2 |
|---|---|---|
| Reel (mm) | 100 | 100 |
| $V_{spooling}$ (cm/s) | 120 | 142 |
| $V_{piston}$ (mm/min) | 0.4 | 0.4–0.6 |
| $\phi_{th}$ untreated (μm) | 22.5 | 20.8–25.5 |
| φ ceramised (μm) | 10.0 | 9.3 |

TABLE 1-continued

|  | E1 | E2 |
|---|---|---|
| $\sigma_R$ (MPa) | 855 | 1021 |
| E (GPa) | 151 | 187 |

The present invention makes it possible to obtain boron nitride fibres with good properties from a new type of polymer produced at ambient temperature.

Example 3

Comparison

A chemical polymer was obtained by reaction of a trichloroborazine (TCB) with n B (Nh$^i$Pr)3, where 1<n<3 and $^i$Pr=isopropyl. In this case, the aminoborane used was tris (isopropylamino) borane.

A spinning test was carried out. Only several filaments of BN were obtained after heat treatment but they were ceramised unstretched.

Said filaments had very poor mechanical properties and the polymer was cross-linked in all directions.

The disadvantages of this method of the prior art are: the non-stoichiometry, the absence of pseudo-linearity of the polymer, which leads to difficult forming and a very low ceramic yield.

These problems do not appear in the production according to the present invention, particularly in the production presented in the above examples.

LIST OF REFERENCES

[1]: R. T. PAINE et al, Chem. Rev., 90, 1990, pp. 73–91.
[2]: C. K. NARULA et al, Chem. Mater., 2, 1990, pp. 384–389.
[3]: EP-A-0 342 673.
[4]: FR-A-2 695 645.
[5]: T. WIDEMAN et al, Chem. Mater., 10, 1998, pp. 412–421.

What is claimed is:

1. A Polymer represented by formula (I):

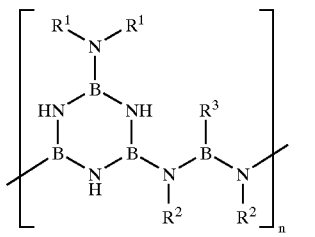

(I)

wherein n is a whole number, $R^1$ and $R^2$ independently represent an alkyl group, and $R^3$ represents an amino group, a hydrogen atom, an alkyl, a cycloalkyl or a boryl.

2. The polymer according to claim 1, wherein $R^1$ and $R^2$ independently represent an alkyl group having from 1 to 3 carbon atoms, and $R^3$ represents an alkyl amine.

3. The polymer according to claim 1, in which $R^1$ represents a methyl group.

4. The polymer according to claim 1, in which $R^1$ and $R^2$ represent a methyl group.

5. The polymer according to claim 1, wherein $R^1$ and $R^2$ represent a methyl group and $R^3$ represents $NHCH_3$.

6. A process for manufacturing a boron nitride fiber comprising:
spinning a precursor polymer to form a polymer fiber and ceramicizing the polymer fiber to form the boron nitride fiber,
wherein the precursor polymer is represented by formula (I):

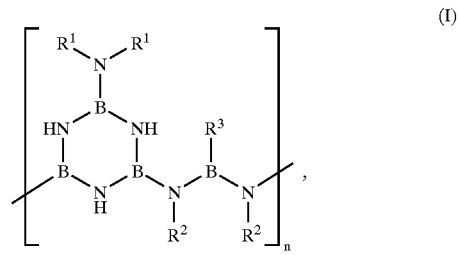

(I)

n is a whole number, $R^1$ and $R^2$ independently represent an alkyl group, and $R^3$ represents an amino group, a hydrogen atom, an alkyl, a cycloalkyl or a boryl.

7. The process according to claim 6, wherein $R^1$ and $R^2$ independently represent an alkyl group having from 1 to 3 carbon atoms, and $R^3$ represents an alkyl amine.

8. The process according to claim 6, in which $R^1$ represents a methyl group.

9. The process according to claim 6, in which $R^1$ and $R^2$ represent a methyl group.

10. The process according to claim 6, in which $R^1$ and $R^2$ represent a methyl group and $R^3$ represents $NHCH_3$.

11. The process according to claim 6, wherein the spinning is carried out at a spinning temperature 30° C.$\leq$Tf–Tg$\leq$100° C., where Tf is the spinning temperature and Tg is the glass transition temperature of the polymer.

12. The process according to claim 6, wherein the spinning is carried out in an atmosphere having a humidity level less than 10%.

13. The process according to claim 6, wherein the ceramicizing is carried out in two stages, which comprises a first pre-ceramisation stage comprising heating the polymer with ammonia up to a temperature less than or equal to 1000° C., and a second stage of ceramisation comprising heating the polymer in a nitrogen and/or noble gas atmosphere at a temperature higher than the first stage in one or several successive operations.

14. The process according to claim 6, wherein the precursor polymer of formula (1) is obtained by the process comprising:
reacting $HN(R^1)_2$ with trichloroborazine to obtain a borazine of formula (II):

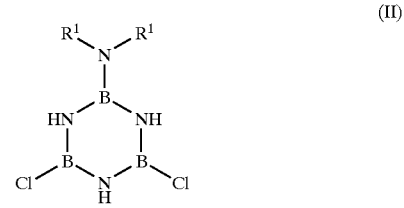

(II)

reacting, without heating, the borazine of formula (II) with an alkyl aminoborane of formula $R^3B(NHR^2)_3$ in the presence of a tertiary amine —$N(R^4)_3$, to obtain said precursor polymer of formula (I), wherein R⁴ is an alkyl group.

15. The process according to claim 14, in which R⁴ is an alkyl group comprising from 1 to 3 carbon atoms.

16. The process according to claim 14, in which R⁴ is the ethyl group.

17. A composite material claim comprising:
said boron nitride fiber produced according to the process as claimed in claim 6, and
at least one additional material.

18. A BN/BN composites comprising:
said boron nitride fiber produced according to the process as claimed in claim 6, and a boron nitride matrix.

19. An oxidation-resistant coating obtained by ceramicizing said polymer as claimed in claim 1 to form said oxidation resistant coating.

20. The process according to claim 14, wherein the process to obtain the polymer precursor is carried out at a temperature from 10 to 35° C. under an inert atmosphere.

21. The process according to claim 13, wherein the temperature of the second stage ranges from 1400 to 2200° C.

22. The process according to claim 14, wherein said reacting $HN(R^1)_2$ with trichloroborazine is carried out in a 1 to 1 molar stoichiometric amount and said reacting the borazine of formula (II) with an alkyl aminoborane of formula $R^3B(NHR^2)_3$ is carried out in a 1 to 1 molar stoichiometric amount.

23. A method of manufacturing a structural part comprising:
manufacturing the boron nitride fiber according to the process as claimed in claim 6, and
forming the boron nitride fiber into the structural part.

24. A method of manufacturing a high structural temperature antenna radome comprising:
manufacturing the boron nitride fiber according to the process as claimed in claim 6, and
forming the boron nitride fiber into the high structural temperature antenna radome.

25. A method of manufacturing a boron nitride foam comprising:
foaming the polymer as claimed in claim 1 to form a foam and
ceramicizing the foam to form the boron nitride foam.

26. A BN/BN composite material comprising:
a boron nitride fiber produced by ceramicizing said polymer as claimed in claim 1 and a boron nitride ceramic matrix.

27. A BN/C composite material comprising:
a boron nitride fiber produced by ceramicizing said polymer as claimed in claim 1 and
at least one material comprising carbon.

28. A method of manufacturing a heat sink comprising:
shaping the polymer as claimed in claim 1 in the form of a heat sink and
ceramicizing the polymer to form the heat sink.

29. The process according to claim 6, wherein the spinning comprises extruding the polymer through a die of 50 to 500 μm and drawing the polymer with a refractory spool with a diameter of between 50 and 200 mm.

30. The process according to claim 11, wherein the spinning is carried out at a spinning temperature of 30° C.≦Tf−Tg≦70° C., wherein Tf is the spinning temperature and Tg is the glass transition temperature of the polymer.

31. The polymer according to claim 1, wherein the polymer has a glass transition temperature of between 25 to 80° C.

32. The process according to claim 13, wherein the temperature of the first stage and the temperature of the second stage are obtained by increasing the temperature at a rate of 5 to 1000° C./h.

33. The process according to claim 13, wherein the temperature of the first stage and the temperature of the second stage are obtained by increasing the temperature at a rate of 15 to 700° C./h.

34. The process according to claim 6, wherein the boron nitride fiber is a continuous hexagonal boron nitride fiber.

35. The process according to claim 6, wherein the boron nitride fiber is woven in the form of at least one filament.

36. The process according to claim 35, wherein the at least one filament has an average tensile strength of at least 800 MPa, an average Young's modulus of 50 to 250 GPa, and an average elongation at break distribution of 0.2 to 2%.

37. The process according to claim 35, wherein the diameter of the at least one filament is from 4 to 25 μm.

38. The process according to claim 6, wherein the boron nitride fiber comprises less than 1% by weight of elements of atomic weight greater than 11.

39. The process according to claim 6, wherein the boron nitride fiber has a specific gravity greater than or equal to 1.8 g/cm³.

40. The process according to claim 36, wherein the boron nitride fiber retains said average tensile strength, said average Young's modulus, and said average elongation at break distribution under natural aging conditions or under accelerated aging at 65° C., in an atmosphere with a relative humidity of 75% for two months.

* * * * *